US012572714B2

(12) United States Patent
Xi et al.

(10) Patent No.: US 12,572,714 B2
(45) Date of Patent: Mar. 10, 2026

(54) INFORMATION PROCESSING DEVICE, INFORMATION PROCESSING METHOD, AND COMPUTER PROGRAM PRODUCT

(71) Applicant: KABUSHIKI KAISHA TOSHIBA, Tokyo (JP)

(72) Inventors: Lele Xi, Tokyo (JP); Arika Fukushima, Kawasaki Kanagawa (JP); Hisashi Yamada, Kawasaki Kanagawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 1051 days.

(21) Appl. No.: 17/652,489

(22) Filed: Feb. 25, 2022

(65) Prior Publication Data

US 2022/0398358 A1    Dec. 15, 2022

(30) Foreign Application Priority Data

Jun. 10, 2021    (JP) ................................. 2021-097440

(51) Int. Cl.
| | |
|---|---|
| *G06N 20/00* | (2019.01) |
| *G06F 30/20* | (2020.01) |
| *G08G 1/01* | (2006.01) |

(52) U.S. Cl.
CPC ........... *G06F 30/20* (2020.01); *G08G 1/0125* (2013.01)

(58) Field of Classification Search
CPC ....... G06F 30/20; G06F 30/28; G08G 1/0125; G06N 20/00; G06Q 10/04; G06Q 30/0201
See application file for complete search history.

(56) References Cited

U.S. PATENT DOCUMENTS

| | | | |
|---|---|---|---|
| 9,183,512 B2 * | 11/2015 | Lehmann | ............... G06N 5/047 |
| 2022/0343215 A1 | 10/2022 | Fukushima et al. | |
| 2023/0030127 A1 * | 2/2023 | Tsunoda | ................. G06N 20/00 |

FOREIGN PATENT DOCUMENTS

| | | |
|---|---|---|
| EP | 3 572 991 A1 | 11/2019 |
| JP | 2000-11289 A | 1/2000 |
| JP | 2010-140074 A | 6/2010 |
| JP | 5349254 B2 | 11/2013 |
| JP | 6283331 B2 | 2/2018 |
| JP | 2019-8689 A | 1/2019 |
| JP | 2019-95895 A | 6/2019 |
| JP | 2020-135231 A | 8/2020 |
| JP | 2022-169206 A | 11/2022 |
| JP | 7527158 B2 * | 8/2024 |

OTHER PUBLICATIONS

Japan Patent Office, Decision to Grant a Patent in JP App. No. 2021-097440, 1 page, and machine translation, 2 pages (Apr. 22, 2024)).

* cited by examiner

*Primary Examiner* — Rehana Perveen
*Assistant Examiner* — Cuong V Luu
(74) *Attorney, Agent, or Firm* — Finnegan, Henderson, Farabow, Garrett & Dunner, LLP

(57) ABSTRACT

According to an embodiment, an information processing device includes one or more processors. The one or more processors are configured to: build a prediction model for predicting prediction data for a second region included in a plurality of regions based on acquired data acquired for one or more first regions included in the plurality of regions; and predict the prediction data based on the acquired data by using the prediction model.

15 Claims, 23 Drawing Sheets

| MESH ID | MESH POSITION | MESH TYPE |
|---------|---------------|-----------|
| x0001 | aa.aaaa, bb.bbbb | BASE POINT |
| x0002 | cc.cccc, dd.dddd | BASE POINT |
| x0003 | ee.eeee, ff.ffff | PERIPHERY |
| ... | ... | ... |

| MESH ID | TIME | STREAM OF PEOPLE |
|---------|------|------------------|
| x0001 | 2021/4/6_12:00:00 | 10000 |
| x0001 | 2021/4/6_13:00:00 | 1000 |
| ... | ... | ... |

| DISTANCE |
|---|
| 3 km |

| BASE POINT MESH ID | TIME | PREDICTION VALUE OF STREAM OF PEOPLE |
|---|---|---|
| x0001 | 2021/4/6_12:00:00-<br>2021/4/6_13:00:00 | 2000 |
| x0002 | 2021/4/6_13:00:00-<br>2021/4/6_14:00:00 | 3000 |
| ... | ... | ... |

| PERIPHERAL MESH ID | INPUT ELEMENT E1: DISTANCE (L) |
|---|---|
| x0003 | 500 m |
| x0004 | 1 km |
| … | … |

| BASE POINT MESH ID | MODEL STRUCTURE | MODEL PARAMETER |
|---|---|---|
| x0001 | Model $G_{A1}(t)$ | $[\alpha_{A1t1}, \alpha_{A1t2}, \cdots]$ |
| x0001 | Model $G_{A2}(t)$ | $[\alpha_{A2t1}, \alpha_{A2t2}, \cdots]$ |
| x0002 | Model $G_{B1}(t)$ | $[\alpha_{B1t1}, \alpha_{B1t2}, \cdots]$ |
| x0002 | Model $G_{B2}(t)$ | $[\alpha_{B2t1}, \alpha_{B2t2}, \cdots]$ |
| ... | ... | ... |

| PERIPHERAL MESH ID | INPUT ELEMENT E1: DISTANCE (L) |
|---|---|
| x0003 | 1 km |
| x0004 | 1.5 km |
| ... | ... |

| MESH ID | BASE POINT MESH ID | MODEL STRUCTURE | ESTIMATION ERROR |
|---------|--------------------|-----------------|-------------------|
| x0003 | x0001 | Model $G_{A1}(t)$ | 10 |
| x0003 | x0001 | Model $G_{A2}(t)$ | 15 |
| ... | ... | ... | ... |

| MESH ID | BASE POINT MESH ID | INPUT ELEMENT E1: DISTANCE (L) | MODEL STRUCTURE | MODEL PARAMETER |
|---------|--------------------|-------------------------------|-----------------|-----------------|
| x0003 | x0001 | 1 km | Model $G_{A1}(t)$ | $\alpha_{A1t}=[\alpha_{A1t1}, \alpha_{A1t2}, \cdots],$ |
| x0004 | x0002 | 2 km | Model $G_{B1}(t)$ | $\alpha_{B1t}=[\alpha_{B1t1}, \alpha_{B1t2}, \cdots],$ |
| ... | ... | ... | ... | ... |

FIG.11

| MESH ID | TIME | PREDICTION VALUE OF STREAM OF PEOPLE |
|---------|------|--------------------------------------|
| x0001 | 2021/4/6_12:00:00-<br>2021/4/6_13:00:00 | 2000 |
| x0002 | 2021/4/6_12:00:00-<br>2021/4/6_13:00:00 | 3000 |
| x0003 | 2021/4/6_12:00:00-<br>2021/4/6_13:00:00 | 1500 |
| x0004 | 2021/4/6_12:00:00-<br>2021/4/6_13:00:00 | 1800 |
| ... | ... | ... |

Figure 12:
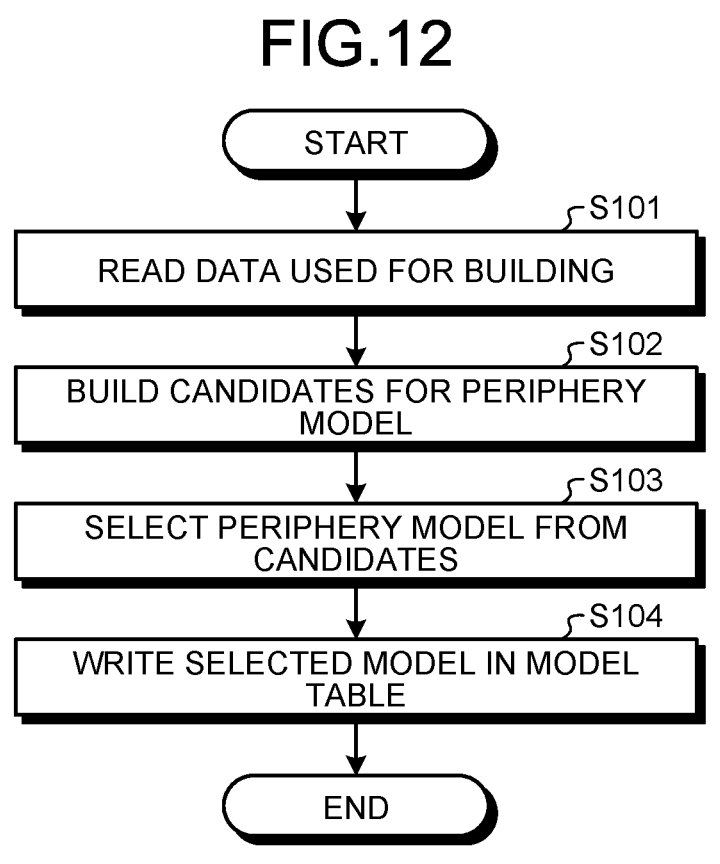

START

S101

READ DATA USED FOR BUILDING

S102

BUILD CANDIDATES FOR PERIPHERY
MODEL

S103

SELECT PERIPHERY MODEL FROM
CANDIDATES

S104

WRITE SELECTED MODEL IN MODEL
TABLE

END

START

S401

READ BASE POINT MESH ID, DISTANCE, MODEL STRUCTURE, AND PARAMETER

S402

READ PREDICTION VALUE OF STREAM OF PEOPLE IN BASE POINT MESH

S403

CALCULATE PREDICTION VALUE OF STREAM OF PEOPLE IN PERIPHERAL MESH

S404

STORE PREDICTION VALUE

END

FIG.16

| PERIPHERAL MESH ID | INPUT ELEMENT E1: DISTANCE (L) | INPUT ELEMENT E2: NUMBER OF TRAIN TRACKS IN MESH ($n_0$) | INPUT ELEMENT E3: NUMBER OF TRAIN TRACKS ($n_1$) WITHIN 1 km AROUND MESH | INPUT ELEMENT E4: USE INFORMATION (J) | INPUT ELEMENT E5: TEMPERATURE (K) |
|---|---|---|---|---|---|
| x0003 | 500 m | 5 | 10 | 1 | 25 |
| x0004 | 1 km | 5 | 15 | 1 | 25 |
| ⋮ | ⋮ | ⋮ | ⋮ | ⋮ | ⋮ |

FIG.17

| MESH ID | BASE POINT MESH ID | INPUT ELEMENT E1: DISTANCE (L) | INPUT ELEMENT E2: USE INFORMATION | MODEL STRUCTURE | MODEL PARAMETER |
|---------|--------------------|-------------------------------|-----------------------------------|-----------------|-----------------|
| x0003 | x0001 | 1 km | BUSINESS AREA | Model $G_{A1}(t)$ | $\alpha_{A1t}=[\alpha_{A1t1}, \alpha_{A1t2}, \cdots],$ |
| x0004 | x0002 | 2 km | GREEN AREA | Model $G_{B1}(t)$ | $\alpha_{B1t}=[\alpha_{B1t1}, \alpha_{B1t2}, \cdots],$ |
| ... | ... | ... | ... | ... | ... |

| INPUT ELEMENT E2: USE INFORMATION | MODEL STRUCTURE |
|---|---|
| BUSINESS AREA | MODEL $G_1$ |
| GREEN AREA | MODEL $G_2$ |
| ... | ... |

| MESH ID | MESH POSITION | MESH TYPE | BASE POINT ID |
|---------|---------------|-----------|---------------|
| x0001 | aa.aaaa, bb.bbbb | BASE POINT | x000A |
| x0002 | cc.cccc, dd.dddd | BASE POINT | x000A |
| x0003 | ee.eeee, ff.ffff | PERIPHERY | |
| ... | ... | ... | ... |

FIG.24

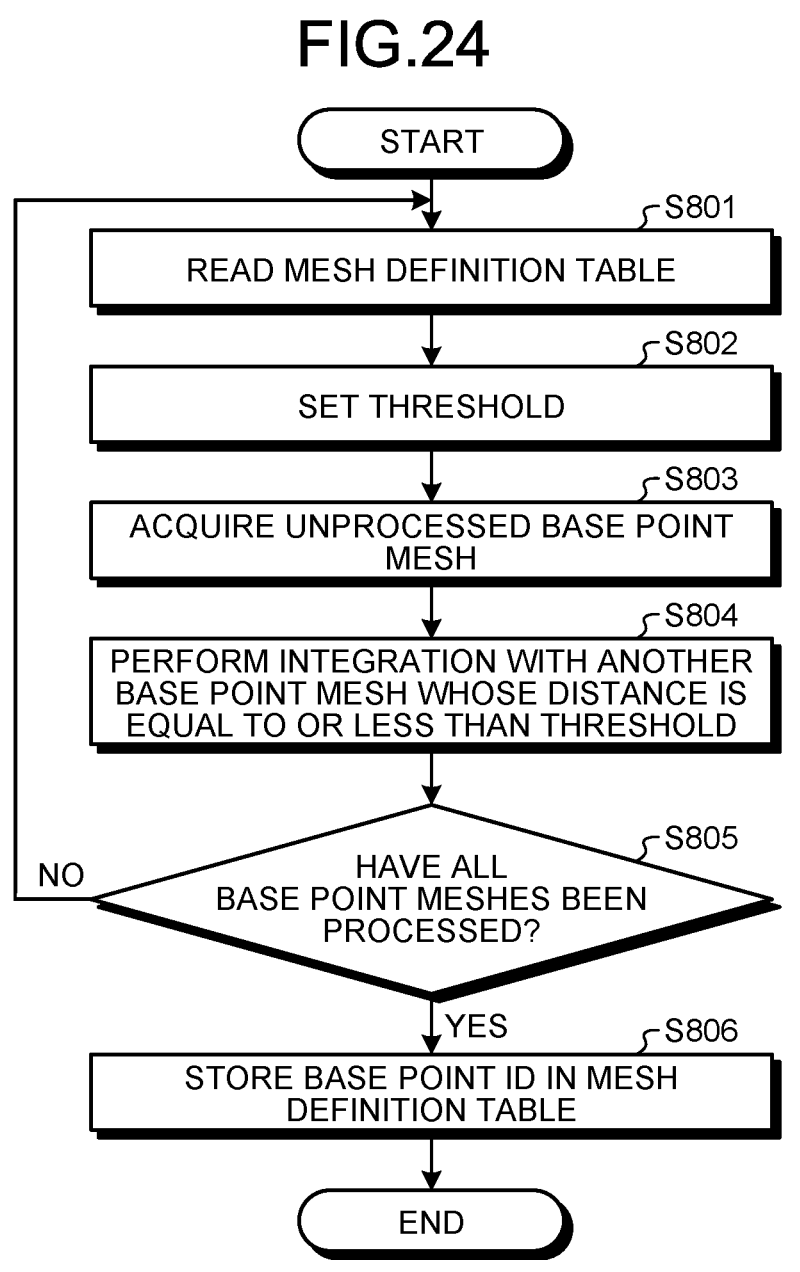

```
        START
          │
          ▼                          ⌐S801
┌─────────────────────────────────┐
│   READ MESH DEFINITION TABLE     │
└─────────────────────────────────┘
          │
          ▼                          ⌐S802
┌─────────────────────────────────┐
│         SET THRESHOLD            │
└─────────────────────────────────┘
          │
          ▼                          ⌐S803
┌─────────────────────────────────┐
│  ACQUIRE UNPROCESSED BASE POINT  │
│              MESH                │
└─────────────────────────────────┘
          │
          ▼                          ⌐S804
┌─────────────────────────────────┐
│ PERFORM INTEGRATION WITH ANOTHER │
│ BASE POINT MESH WHOSE DISTANCE IS│
│ EQUAL TO OR LESS THAN THRESHOLD  │
└─────────────────────────────────┘
          │
          ▼                          ⌐S805
       ◇ HAVE ALL
  NO  BASE POINT MESHES BEEN
      PROCESSED?
          │ YES                      ⌐S806
          ▼
┌─────────────────────────────────┐
│   STORE BASE POINT ID IN MESH    │
│        DEFINITION TABLE          │
└─────────────────────────────────┘
          │
          ▼
         END
```

INFORMATION PROCESSING DEVICE, INFORMATION PROCESSING METHOD, AND COMPUTER PROGRAM PRODUCT

CROSS-REFERENCE TO RELATED APPLICATIONS

This application is based upon and claims the benefit of priority from Japanese Patent Application No. 2021-097440, filed on Jun. 10, 2021; the entire contents of which are incorporated herein by reference.

FIELD

Embodiments described herein relate generally to an information processing device, an information processing method, and a computer program product.

BACKGROUND

A technique for predicting data at a designated time point by using a model estimated from data obtained in the past has been proposed. For example, a technique of predicting the number, density, or the like of people at a certain point and a certain time point by using a model for predicting data representing a stream of people (people stream) between a plurality of points has been proposed.

An object of the present disclosure is to provide an information processing device, an information processing method, and a computer program product capable of performing prediction of data using a model with higher accuracy.

BRIEF DESCRIPTION OF THE DRAWINGS

FIG. 2 is a diagram illustrating an example of a data structure of a mesh definition table;

FIG. 3 is a diagram illustrating an example of a data structure of a stream-of-people table;

FIG. 4 is a diagram illustrating an example of a data structure of a learning setting file;

FIG. 5 is a diagram illustrating an example of a data structure of a base point prediction value table;

FIG. 6 is a diagram illustrating an example of a data structure of a learning input element table;

FIG. 7 is a diagram illustrating an example of a data structure of a candidate table;

FIG. 8 is a diagram illustrating an example of a data structure of a selection input element table;

FIG. 9 is a diagram illustrating an example of a data structure of an error table;

FIG. 10 is a diagram illustrating an example of a data structure of a model table;

FIG. 11 is a diagram illustrating an example of a data structure of a prediction value table;

FIG. 12 is a flowchart of model building processing;

FIG. 16 is a diagram illustrating an example of a data structure of a learning input element table according to a modified example;

FIG. 17 is a diagram illustrating an example of a data structure of a model table according to a modified example;

FIG. 18 is a diagram illustrating an example of a data structure of a selected model table according to a modified example;

FIG. 22 is a diagram illustrating an example of a data structure of a mesh definition table according to the second embodiment;

FIG. 24 is a flowchart of integration processing according to the second embodiment;

DETAILED DESCRIPTION

Figure 1:
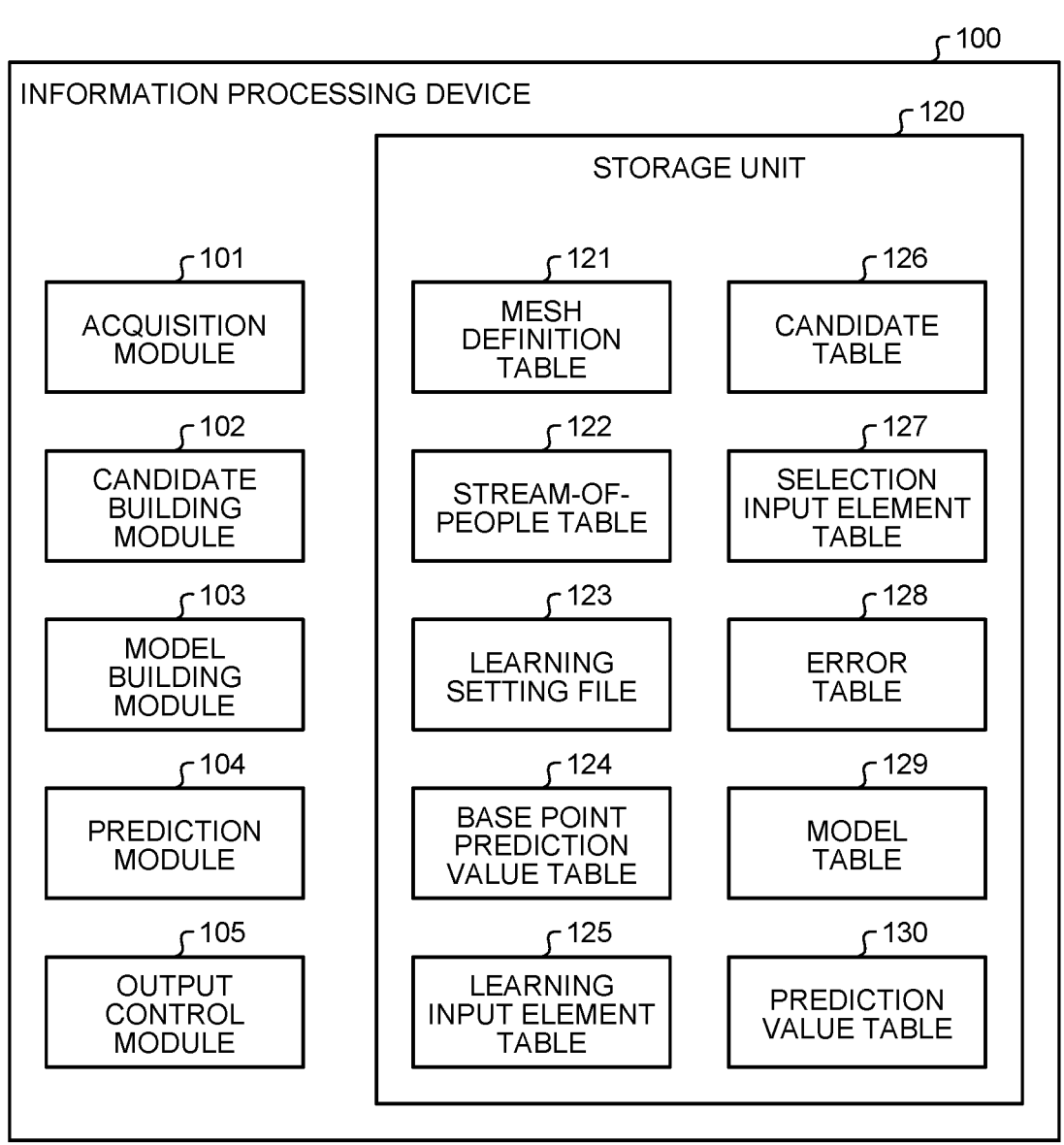
FIG. 1 is a block diagram of an information processing device according to a first embodiment.

According to an embodiment, an information processing device includes one or more processors. The one or more processors are configured to: build a prediction model for predicting prediction data for a second region included in a plurality of regions based on acquired data acquired for one or more first regions included in the plurality of regions; and predict the prediction data based on the acquired data by using the prediction model.

Hereinafter, an information processing device according to a preferred embodiment of the present disclosure will be described in detail with reference to the accompanying drawings.

An apparatus that predicts data by using a model may be configured to predict data (for example, data representing a stream of people) for each of a plurality of sections (mesh) obtained by dividing a certain region. In a case where there is movement trajectory data for each individual, it is easy to estimate the stream of people for each section. However, there is a case where the movement trajectory data for each individual cannot be obtained due to privacy protection or collection difficulty. On the other hand, data regarding a density of people is easily collected because privacy is protected and tracking for each individual is unnecessary.

As a technique of estimating a stream of people, for example, a technique of estimating a stream of people based on a probability of movement from a certain point to another point has been proposed. In such a technique, input data representing the number of moving people (or density) for each target point is usually required. Therefore, in a case where the input data for all points cannot be obtained, it is not possible to estimate a stream of people with high accuracy.

The information processing device according to each of the following embodiments classifies a plurality of regions, which are prediction targets, into a region serving as a base point (first region) and a periphery of the base point (second region). Then, the information processing device builds a prediction model for predicting of stream-of-people data for the periphery based on stream-of-people data (an example of prediction data) acquired for the base point, and predicts the stream-of-people data for the periphery by using the prediction model. Hereinafter, the prediction model for predicting the stream-of-people data for the periphery is referred to as a periphery model.

Therefore, for example, even in a case where the input data cannot be obtained for the periphery, accuracy in predicting data (for example, the stream of flow) by using the periphery model can be improved. In addition, since it is sufficient that the input data can be acquired only for the base point, the configuration for acquiring the input data can be simplified.

Note that, in each of the following embodiments, a case where the stream-of-people data (an example of the prediction data) indicating population in a section is predicted will be described as an example. The stream-of-people data is, for example, a population (the number of people) or a population density. Data to be predicted is not limited to the stream-of-people data, and may be any other data such as power consumption and weather information.

First Embodiment

FIG. 1 is a block diagram illustrating an example of a configuration of an information processing device 100 according to a first embodiment. As illustrated in FIG. 1, the information processing device 100 includes an acquisition module 101, a candidate building module 102, a model building module 103, a prediction module 104, an output control module 105, and a storage unit 120.

The storage unit 120 stores various pieces of data used in various processes performed by the information processing device 100. For example, the storage unit 120 stores a mesh definition table 121, a stream-of-people table 122, a learning setting file 123, a base point prediction value table 124, a learning input element table 125, a candidate table 126, a selection input element table 127, an error table 128, a model table 129, and a prediction value table 130.

FIG. 2 is a diagram illustrating an example of a data structure of the mesh definition table 121. The mesh definition table 121 includes a mesh ID, a mesh position, and a mesh type.

A mesh indicates sections obtained by dividing a geographical space in a lattice shape. The mesh is an example of a plurality of regions that are prediction targets. The plurality of regions that are prediction targets are not limited to the mesh. For example, the following regions can be used.

Divided regions having substantially the same size based on latitude and longitude Districts surrounded by boundary lines of municipality and addresses The mesh ID is identification information for identifying the mesh. The mesh position is a position of the corresponding mesh. The mesh position is represented by, for example, latitude and longitude of the center of the mesh, but may be represented in any other manner.

The mesh type indicates a type of the mesh. In the present embodiment, the base point or the periphery is set as the mesh type. The base point represents a mesh for which the stream-of-people data is acquired in advance. The periphery is a mesh other than the base point and represents a mesh corresponding to the periphery of the base point. Hereinafter, a mesh whose mesh type is the base point may be referred to as a base point mesh, and a mesh whose mesh type is the periphery may be referred to as a peripheral mesh.

In the present embodiment, it is assumed that whether the mesh type is the base point or the periphery is determined in advance. Note that, in a second embodiment, an example of determining and classifying the mesh type will be described.

FIG. 3 is a diagram illustrating an example of a data structure of the stream-of-people table 122. The stream-of-people table 122 includes a mesh ID, a time, and a stream of people. The time is described in a format of "YYYY/MM/DD_hh:mm:ss". The time indicates a start time of a period in which the stream of people is observed. An end time of the period is a time point immediately before a start time of the next row. The stream of people represents population (the number of people) or population density at the corresponding time (period) of the corresponding mesh.

FIG. 4 is a diagram illustrating an example of a data structure of the learning setting file 123. The learning setting file 123 sets a parameter to be used at the time of training the periphery model. For example, the learning setting file 123 includes a distance. The distance represents, for example, a Euclidean distance from the center of the base point mesh. A mesh whose Euclidean distance from the center of a certain base point mesh is equal to or less than the distance described in the learning setting file 123 is used as a peripheral mesh for learning for this base point mesh. The starting point of the distance is not limited to the center of the base point mesh, and may be, for example, the closest point among the points included in the base point mesh.

FIG. 5 is a diagram illustrating an example of a data structure of the base point prediction value table 124. The base point prediction value table 124 is a table that stores prediction values of the stream of people predicted in advance for the base point mesh. The prediction value is an example of acquired data acquired for the base point mesh (an example of a first region). The prediction value of the base point mesh is a value predicted using a model for the base point mesh or the like. The stream of people of the base point mesh does not have to be predicted by the model or the like, and may be an observed value. A method of obtaining the prediction value of the base point mesh or a method of obtaining the observed value may be any method.

The base point prediction value table 124 includes a base point mesh ID, time, and a prediction value of a stream of people. The base point mesh ID represents a mesh ID of the base point mesh. The time is described in a format of "YYYY/MM/DD_hh:mm:ss-YYYY/MM/DD_hh:mm:ss". The time represents a period in which the prediction value of the stream of people is predicted. A time point before the symbol "—" represents a start time of the period, and a time point after the symbol "—" represents an end time of the period. The stream-of-people prediction value represents the prediction value at the corresponding time of the corresponding base point mesh.

The mesh definition table 121, the stream-of-people table 122, and the learning setting file 123 are prepared in advance before the periphery model building (learning) processing. Further, the base point prediction value table 124 is prepared before stream-of-people prediction processing for the peripheral mesh using the periphery model. The other table is used to store data output in building processing or prediction processing.

FIG. 6 is a diagram illustrating an example of a data structure of the learning input element table 125. The learning input element table 125 is used to temporarily store data regarding the peripheral mesh that is referred to when the periphery model for each base point mesh is built. The learning input element table 125 includes a peripheral mesh ID and an input element E1.

As the peripheral mesh ID, the mesh ID of the peripheral mesh determined for use in building the periphery model is described. The input element E1 is an element that is a value input to the periphery model, and in this example, a distance is described as the input element E1. The distance represents, for example, a Euclidean distance from the base point mesh (such as the center) for which the periphery model is built to the peripheral mesh. The input element is not limited to the distance, and may be an element other than the distance. As described later, a plurality of input elements may be used.

Note that the input element can be interpreted as attribute information indicating an attribute of the mesh. The periphery model may be configured to output different prediction values according to the attribute information.

FIG. 7 is a diagram illustrating an example of a data structure of the candidate table 126. The candidate table 126 includes a base point mesh ID, a model structure, and a model parameter. The model structure indicates information for specifying a structure of the periphery model trained for the base point mesh identified by the corresponding base point mesh ID. As described later, periphery models having a plurality of different structures are built for one base point mesh. The model structure is information for specifying the structures (types) of these periphery models. For example, for a base point mesh with a base point mesh ID=x0001, $G_{An}(t)$ ($1 \leq n \leq N$, and N is the number of periphery models to be built) is set as the model structure.

As the model parameter, a parameter learned by the corresponding periphery model is set. For example, a parameter $\alpha_{An}(t)=[\alpha_{Ant1}(t), \alpha_{Ant2}(t), \ldots]$ learned by the periphery model with the model structure $G_{An}(t)$ is set as the model parameter.

FIG. 8 is a diagram illustrating an example of a data structure of the selection input element table 127. The selection input element table 127 stores information that is referred to when an optimal periphery model is selected from a plurality of built periphery models. Details of a method of selecting the periphery model will be described later.

The selection input element table 127 includes a peripheral mesh ID and an input element E1. Similarly to the learning input element table 125, the input element E1 is a Euclidean distance from the base point mesh. In the selection input element table 127, a distance from the base point mesh to which the peripheral mesh belongs is set. A method of determining the base point mesh to which the base point mesh belongs will be described later.

FIG. 9 is a diagram illustrating an example of a data structure of the error table 128. The error table 128 includes a mesh ID, a base point mesh ID, a model structure, and an estimation error. The mesh ID of the base point mesh to which the corresponding peripheral mesh belongs is set as the base point mesh ID. As the model structure, the structure $G_{An}(t)$ of the periphery model built for the corresponding peripheral mesh is set. An error of the stream of people estimated by the corresponding periphery model is set as the estimation error.

FIG. 10 is a diagram illustrating an example of a data structure of the model table 129. The model table 129 is a table that stores data regarding the periphery model selected with reference to the error table 128 and the like.

The model table 129 includes a mesh ID of a peripheral mesh, a mesh ID (base point mesh ID) of a base point mesh to which the peripheral mesh belongs, an input element E1, a model structure, and a model parameter. As the model structure, the structure $G_{An}(t)$ of the periphery model selected for the corresponding peripheral mesh is set. As the model parameter, a model parameter of the selected periphery model is set. The selected periphery model can be interpreted as a model indicating a relationship between the corresponding peripheral mesh and the base point mesh to which the peripheral mesh belongs.

FIG. 11 is a diagram illustrating an example of a data structure of the prediction value table 130. The prediction value table 130 is a table for storing prediction value such as the prediction value of the stream of people obtained by using the selected periphery model.

The prediction value table 130 includes a mesh ID, time, and a prediction value of a stream of people. As the mesh ID, a mesh ID of a prediction target mesh including the peripheral mesh and the base point mesh is set. Similarly to the base point prediction value table 124, the time is described in the format of "YYYY/MM/DD_hh:mm:ss-YYYY/MM/DD_hh:mm:ss". A prediction value of a stream of people at the corresponding time of the corresponding mesh is set as the prediction value of the stream of people.

The storage unit 120 can be implemented by any generally used storage medium such as a flash memory, a memory card, a random access memory (RAM), a hard disk drive (HDD), or an optical disc.

The storage unit 120 may include a plurality of physically different storage media. For example, the pieces of data (the mesh definition table 121, the stream-of-people table 122, the learning setting file 123, the base point prediction value table 124, the learning input element table 125, the candidate table 126, the selection input element table 127, the error table 128, the model table 129, and the prediction value table 130) may be stored in different storage media, respectively.

Returning to FIG. 1, the acquisition module 101 acquires various pieces of data used in various processes performed by the information processing device 100. For example, the acquisition module 101 acquires the respective tables (the mesh definition table 121, the stream-of-people table 122, and the learning setting file 123) used for building the periphery model, a table (the base point prediction value table 124) used for predicting the stream of people, and the like. A method of acquiring information by the acquisition module 101 may be any method. For example, a method of acquiring (receiving) information from an external apparatus connected via a network or the like, a method of acquiring information input by an input device (a keyboard, a touch panel, or the like) included in the information processing device 100, or the like can be applied.

The candidate building module 102 builds a plurality of periphery model candidates. As described above, each periphery model is a model for predicting the stream-of-people data (prediction data) for the peripheral mesh from the prediction value (acquired data) of the stream of people acquired for the base point mesh.

The model building module 103 builds one periphery model for each peripheral mesh by using the plurality of periphery model candidates built by the candidate building module 102. For example, the model building module 103 builds, as the periphery model for the peripheral mesh, a candidate having a smaller error between the prediction value and a true value than other candidates among the plurality of periphery model candidates. Details of the model building processing performed by the model building module 103 will be described later.

The prediction module 104 performs prediction processing of predicting the stream-of-people data for the peripheral mesh from the stream-of-people data (acquired data) acquired for the base point mesh by using the periphery model built by the model building module 103.

The output control module 105 controls output processing for various pieces of data, the output processing being performed by the information processing device 100. For example, the output control module 105 outputs a prediction result of the prediction module 104. The output control module 105 may output the stream-of-people data acquired for the base point together with the stream-of-people data for the peripheral mesh that is the prediction result of the prediction module 104. A method of outputting information by the output control module 105 may be any method, For example, a method of displaying information on a display device, a method of transmitting information to an external apparatus connected via a network or the like, or the like can be applied.

Each of the above units (the acquisition module 101, the candidate building module 102, the model building module 103, the prediction module 104, and the output control module 105) is implemented by, for example, one or more processors. For example, each of the above units may be implemented by causing a processor such as a central processing unit (CPU) to execute a program, that is, by software. Each of the above units may be implemented by a processor such as a dedicated integrated circuit (IC), that is, hardware. Each of the above units may be implemented by using software and hardware in combination. In a case of using a plurality of processors, each processor may implement one of the respective units, or may implement two or more of the respective units.

Note that FIG. 1 illustrates an example in which the information processing device 100 has both a function of building the periphery model (building function) and a function of performing prediction using the built model (prediction function). The information processing device 100 may be configured to have only one of these functions. For example, in a case where the information processing device 100 has only the building function, the information processing device 100 does not have to include the prediction module 104.

Next, the model building processing performed by the information processing device 100 according to the first embodiment will be described. FIG. 12 is a flowchart illustrating an example of the model building processing according to the first embodiment.

The candidate building module 102 reads, from each table, various pieces of data used for building the periphery model candidates (Step S101). For example, the candidate building module 102 reads the data of the mesh definition table 121, the stream-of-people table 122, and the learning setting file 123.

The candidate building module 102 performs the candidate building processing of building the periphery model candidates for each base point mesh by using the read data (Step S102). Details of the candidate building processing will be described later.

Next, the model building module 103 performs selection processing of selecting the periphery model from among the plurality of built periphery model candidates (Step S103). The selection processing is, for example, processing of determining the periphery model for each peripheral mesh by selecting one periphery model from the plurality of periphery model candidates. Details of the selection processing will be described later.

The model building module 103 writes information indicating the selected periphery model in the model table 129 (Step S104), and ends the model building processing.

Figure 13:
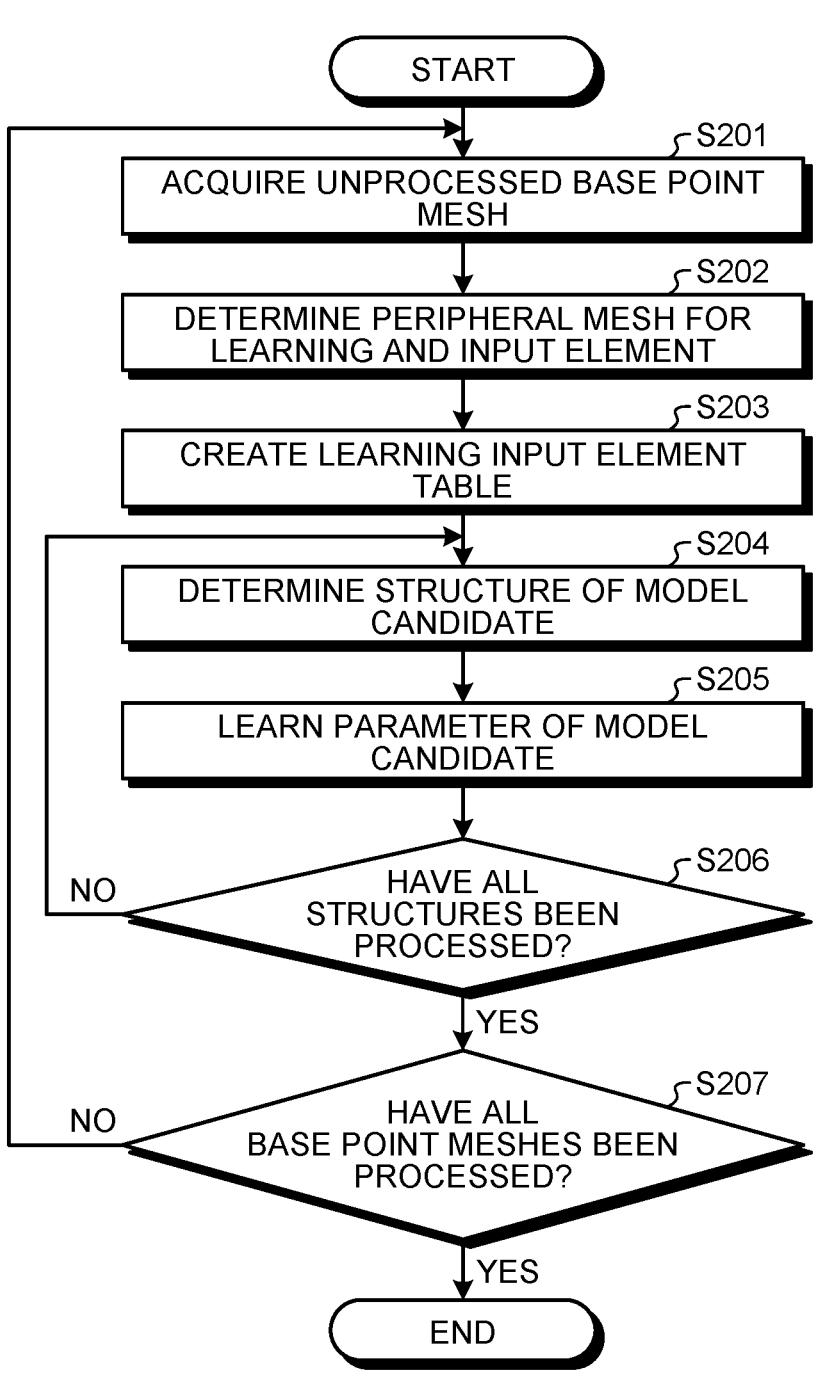
FIG. 13 is a flowchart of candidate building processing.

Next, details of the candidate building processing in Step S102 will be described. FIG. 13 is a flowchart illustrating an example of the candidate building processing.

The candidate building module 102 acquires an unprocessed base point mesh among the base point meshes stored in the mesh definition table 121 (Step S201). Whether or not a mesh is the base point mesh can be determined based on whether or not the mesh type in the mesh definition table 121 is "base point".

The candidate building module 102 determines the peripheral mesh for learning and the input element (Step S202). For example, the candidate building module 102 determines one or more peripheral meshes present within the distance set in the learning setting file 123 from the center of the acquired base point mesh as the peripheral meshes for learning. In addition, the candidate building module 102 determines a distance from the center of the base point mesh to the center of the peripheral mesh for learning as the input element E1.

The candidate building module 102 creates the learning input element table 125 (Step S203). For example, the candidate building module 102 calculates a Euclidean distance between the acquired center of the base point mesh and the center of the peripheral mesh for learning, and stores the calculated distance and the mesh ID (peripheral mesh ID) of the peripheral mesh in association with each other in the learning input element table 125.

The candidate building module 102 determines the structure G(t) of the periphery model candidate (Step S204). For example, the candidate building module 102 sequentially determines one of structures of a plurality of predetermined candidates. The structures of the plurality of candidates may be any model such as an exponential model, a regression model, or a neural network model.

The candidate building module 102 obtains the parameter of the periphery model candidate having the determined structure by learning (Step S205). For example, the candidate building module 102 sets the stream of people obtained from the stream-of-people table 122 as correct answer data, and learns the parameter of the periphery model candidate so as to reduce an error from the correct answer data.

The learning method may be any learning method that can be applied according to the structure of the model. Hereinafter, an example of the learning method in a case where the structure of the periphery model candidate is the exponential model will be described.

A learning data set used for learning includes y(t), p(t), and L. y(t) represents a stream of people (correct answer data) in the t-th time zone (t=1, . . . , or T) obtained from the stream-of-people table 122. p(t) represents the obtained stream-of-people value for the base point mesh, and can be obtained from, for example, the base point prediction value table 124. L represents the distance obtained from the learning input element table 125.

The exponential model with the Euclidean distance L to the base point mesh as the input element is expressed by, for example, the following Equation (1).

$$y(t) = \alpha_1(t)p(t)e^{\alpha_2(t)L} \tag{1}$$

The candidate building module 102 can obtain a parameter $\alpha(t)$ of the periphery model candidate by, for example, the least squares method expressed by the following Equation (2). Note that a method of calculating the parameter is not limited to the least squares method, and any method may be used. For example, other optimization methods such as a maximum likelihood estimation method, a Bayesian estimation method, and a quasi-Newton method may be used.

$$\underset{\alpha(\tau)}{\mathrm{argmin}} \sum_{\tau=1}^{T} \left( y(\tau) - \alpha_1(\tau) p(\tau) e^{-\alpha_2(\tau)L} \right)^2 \qquad (2)$$

The candidate building module 102 stores the obtained parameter in the candidate table 126. Note that a model $G_{A1}(t)$ and a model $G_{A2}(t)$ set in the model structure of FIG. 7 represent two periphery model candidates trained for the base point mesh with the base point mesh ID=x0001, respectively. For example, the model $G_{A1}(t)$ corresponds to the exponential model, and the model $G_{A2}(t)$ corresponds to the regression model.

The candidate building module 102 determines whether or not all the structures (for example, the exponential model, the regression model, and the neural network model) of the plurality of predetermined candidates have been processed (Step S206). In a case where not all the structures have been processed (Step S206: No), the processing returns to Step S204, and the processing is repeated for the unprocessed structure.

In a case where all the structures have been processed (Step S206: Yes), the candidate building module 102 determines whether or not all the base point meshes have been processed (Step S207). In a case where not all the base point meshes have been processed (Step S207: No), the processing returns to Step S201, and the processing is repeated for the unprocessed base point mesh. In a case where all the base point meshes have been processed (Step S207: Yes), the candidate building module 102 ends the candidate building processing.

Figure 14:
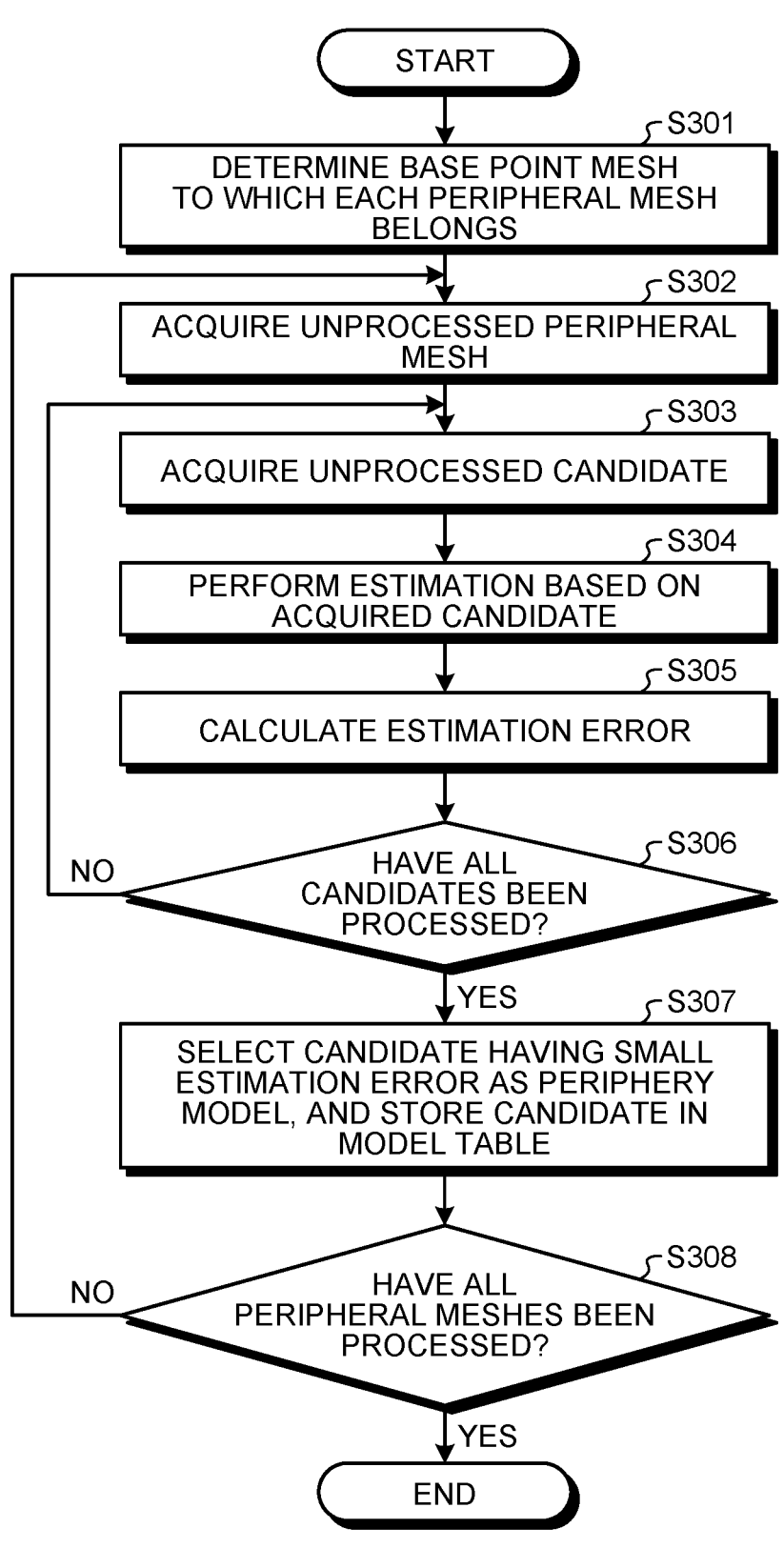
FIG. 14 is a flowchart of selection processing.

Next, details of the selection processing in Step S103 will be described. FIG. 14 is a flowchart illustrating an example of the selection processing.

The model building module 103 reads the mesh position and the mesh type of each mesh from the mesh definition table 121, and determines to which base point mesh each peripheral mesh belongs (Step S301). For example, the model building module 103 determines that each peripheral mesh belongs to the base point mesh having the minimum Euclidean distance. The model building module 103 stores the peripheral mesh ID of each peripheral mesh and the distance from the base point mesh to which each peripheral mesh belongs in association with each other in the selection input element table 127.

For each peripheral mesh, the periphery model is determined by the following processes in Steps S302 to S307. First, the model building module 103 acquires an unprocessed peripheral mesh (Step S302). The model building module 103 acquires unprocessed periphery model candidates (Step S303). The periphery model candidate is a candidate built for the base point mesh to which the peripheral mesh belongs, and can be acquired from the candidate table 126.

The model building module 103 estimates the stream of people of the acquired peripheral mesh by using the structure $G_{An}(t)$ of the acquired periphery model candidate, the learned parameter $\alpha_{Ann}$, and the distance L that is the input element stored in the selection input element table 127 (Step S304).

The model building module 103 compares an estimated value of the stream of people with a true value of the stream-of-people value obtained from the stream-of-people table 122, and calculates the estimation error (Step S305). The estimation error may be calculated by any method such as mean absolute error (MAE), mean square error (MSE), and root mean square error (RMSE). The model building module 103 stores the calculated estimation error in the error table 128.

The model building module 103 determines whether or not all the candidates have been processed (Step S306). In a case where not all the candidates have been processed (Step S306: No), the processing returns to Step S303, and the processing is repeated for the next unprocessed candidate.

In a case where all the candidates have been processed (Step S306: Yes), the model building module 103 selects a candidate having an estimation error smaller than that of the other candidates (for example, a candidate having the smallest estimation error) as the periphery model for the peripheral mesh currently being processed, and stores the selected candidate in the model table 129 (Step S307).

The model building module 103 determines whether or not all the peripheral meshes have been processed (Step S308). In a case where not all the peripheral meshes have been processed (Step S308: No), the processing returns to Step S302, and the processing is repeated for the next unprocessed peripheral mesh.

In a case where all the peripheral meshes have been processed (Step S308: Yes), the model building module 103 ends the selection processing.

Note that there may be a plurality of base point meshes having the minimum Euclidean distance. In such a case, the model building module 103 may calculate the estimation error of each candidate for each of the plurality of base point meshes, determine a base point mesh corresponding to a candidate having the smallest estimation error as a base point mesh to which the peripheral mesh belongs, and select the candidate as the periphery model.

Figure 15:
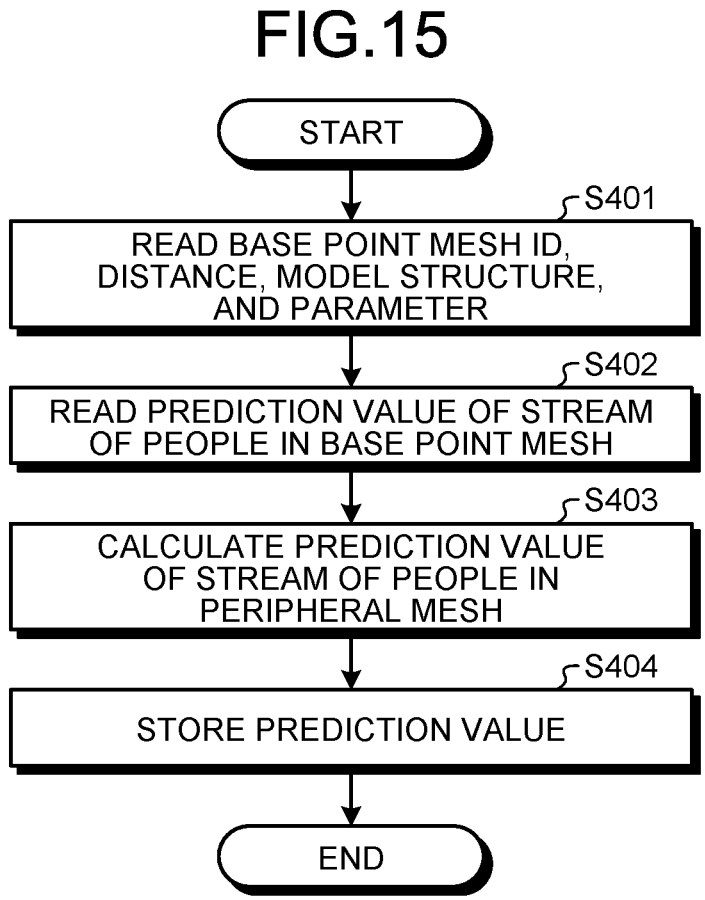
FIG. 15 is a flowchart of prediction processing.

Next, the prediction processing performed by the prediction module 104 will be described in detail. FIG. 15 is a flowchart illustrating an example of the prediction processing. Note that FIG. 15 illustrates an example of processing of predicting the stream of people for one peripheral mesh. In a case of predicting the stream of people for a plurality of peripheral meshes, the prediction processing as illustrated in FIG. 15 may be performed for each of the plurality of peripheral meshes.

The prediction module 104 reads the base point mesh ID of the base point mesh to which the peripheral mesh belongs, the input element E1 (distance L), the model structure G(t) of the periphery model, and the model parameter $\alpha(t)$ from the model table 129 (Step S401). The prediction module 104 reads the prediction value p(t) of the stream of people of the base point mesh identified by the read base point mesh ID from the base point prediction value table 124 (Step S402).

The prediction module 104 calculates the prediction value of the stream of people in the peripheral mesh by using each piece of read information (Step S403). For example, in a case where the model structure G(t) is the exponential model, the prediction module 104 can calculate the stream of people y(t) at the time t by putting the model parameters $\alpha_1(t)$, $\alpha_2(t)$, the distance L, and the prediction value p(t) of the stream of people in the base point mesh into Equation (1).

The prediction module 104 stores the calculated prediction value of the stream of people in the prediction value table 130 (Step S404), and ends the prediction processing. Thereafter, the output control module 105 may output a result of the prediction processing. The prediction module 104 may store the prediction value p(t) of the stream of people in the base point mesh and the prediction value of the stream of people in the peripheral mesh in the prediction value table 130. As a result, for example, the output control module 105 can read the prediction value to be output from one table (prediction value table 130).

First Modified Example

As described above, the input element is not limited to only the distance L, and the number of input elements may be plural. In the present modified example, an example in which an input element other than the distance L is further used will be described.

Examples of the input element other than the distance L include at least one of information on traffic in the mesh (traffic information), information indicating the use of the mesh (use information), and weather information of the mesh. More specific examples of the traffic information may include the number of train tracks in the mesh, the number of train tracks present around the mesh, the number of bus stops, the number of people using traffic, and the like. The weather information is, for example, a temperature (air temperature) in the mesh.

FIG. 16 is a diagram illustrating an example of data structures of the learning input element table 125 and the selection input element table 127 used in the present modified example. As illustrated in FIG. 16, in the present modified example, the following four input elements are added.

Input element E2: the number ($n_0$) of train tracks in the mesh

Input element E3: the number ($n_1$) of train tracks within 1 km around the mesh Input element E4: the use information (for example, J is 1 in a case of a green area with few people, and J is 0 in other cases)

Input element E5: a temperature (k)

The use information (regional characteristic) may be represented as, for example, "residential area", "office area", "commercial use area", "industrial area", and "green area". Note that these pieces of use information are merely examples, and for example, the use information may be determined in accordance with "use area" defined in Article 8 of the City Planning Act in Japan.

In the present modified example, the candidate building module 102 determines the structure G(t) of the periphery model candidate by using a plurality of input elements. Hereinafter, an example in which the structure of the periphery model candidate is the exponential model will be described.

The learning data set used for learning includes $n_0$, $n_1$, J, and k in addition to y(t), p(t), and L. $n_0$, $n_1$, J, and k are obtained from the learning input element table 125.

The exponential model using the new input elements is expressed by, for example, the following Equation (3). $k_0$ represents a comfortable temperature when there is a large stream of people.

$$y(t) = \alpha_1(t)p(t)e^{\frac{-\alpha_2(t)L}{n_0+\alpha_3(t)n_1+1}+\alpha_4(t)J+\alpha_5(t)(k-k_0)^2} \quad (3)$$

The candidate building module 102 can obtain the parameter $\alpha(t)$ by, for example, the least squares method expressed by the following Equation (4).

$$\underset{\alpha(\tau)}{\mathrm{argmin}}\sum_{\tau=1}^{T}\left(y(\tau) - \alpha_1(\tau)p(\tau)e^{\frac{-\alpha_2(\tau)L}{n_0+\alpha_3(\tau)n_1+1}+\alpha_4(\tau)J+\alpha_5(\tau)(k-k_0)^2}\right)^2 \quad (4)$$

Second Modified Example

In a second modified example, an example in which the selection processing is switched so as to select the model structure of the periphery model by using the past selection result will be described. In the present modified example, a model structure most frequently selected for a certain input element (attribute information) up to a certain time point (specific time point) is selected as the model structure for the input element after the certain time point. Hereinafter, a case where the distance and the use information are used as the input elements will be described as an example. For example, a model structure most frequently selected for each piece of use information before a certain time point is determined, and after the time point, the model structure determined for the use information is selected for each use information.

FIG. 17 is a diagram illustrating an example of a data structure of the model table 129 used in the present modified example. As illustrated in FIG. 17, in the present modified example, the input element E2 (use information) is added as the input element. As the use information, for example, information indicating use of a land such as "business area" and "green area" is set. The use information may be designated by a numerical value such as 1 or 0 similarly to the use information J that is the input element E4 of the first modified example.

FIG. 18 is a diagram illustrating an example of a data structure of a selected model table used in the present modified example. The selected model table is used to store the most frequently selected model structure for each use information. As illustrated in FIG. 18, the selected model table stores the use information and the model structure selected for the use information in association with each other. In FIG. 18, for example, a model $G_1$ corresponds to the exponential model, and a model $G_2$ corresponds to the regression model.

Note that although only one selected model structure is stored in the selected model table of FIG. 18, for example, information indicating a selection ratio may be stored for each of a plurality of model structures. In this case, the model building module 103 may be configured to select a model structure having the largest ratio and perform learning processing to be described later.

Figure 19:
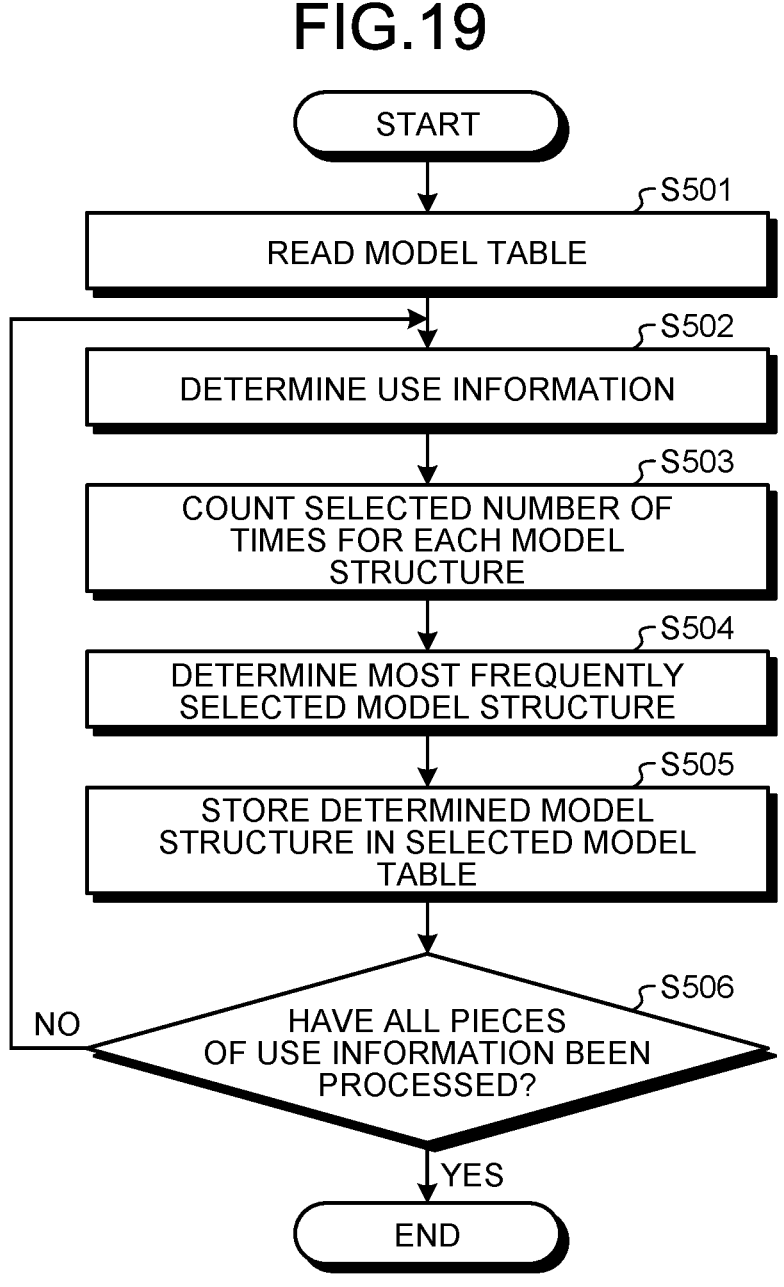
FIG. 19 is a flowchart of structure determination processing according to a modified example.

FIG. 19 is a flowchart illustrating an example of structure determination processing according to the present modified example. The model building module 103 reads the model table 129 (Step S501). The model building module 103 determines unprocessed use information among pieces of use information included in the read model table 129 (Step S502).

The model building module 103 counts the number of times the model structure is selected for each model structure selected for the determined use information (Step S503). The model building module 103 refers to the counted number of times and determines the most frequently selected model structure (Step S504). The model building module 103 stores the determined model structure in the selected model table (Step S505).

The model building module 103 determines whether or not all pieces of use information have been processed (Step S506). In a case where not all the pieces of use information have been processed (Step S506: No), the processing returns to Step S502, and the processing is repeated for the next unprocessed use information. In a case where all the pieces of use information have been processed (Step S506: Yes), the model building module 103 ends the most frequently selected model determination processing.

Figure 20:
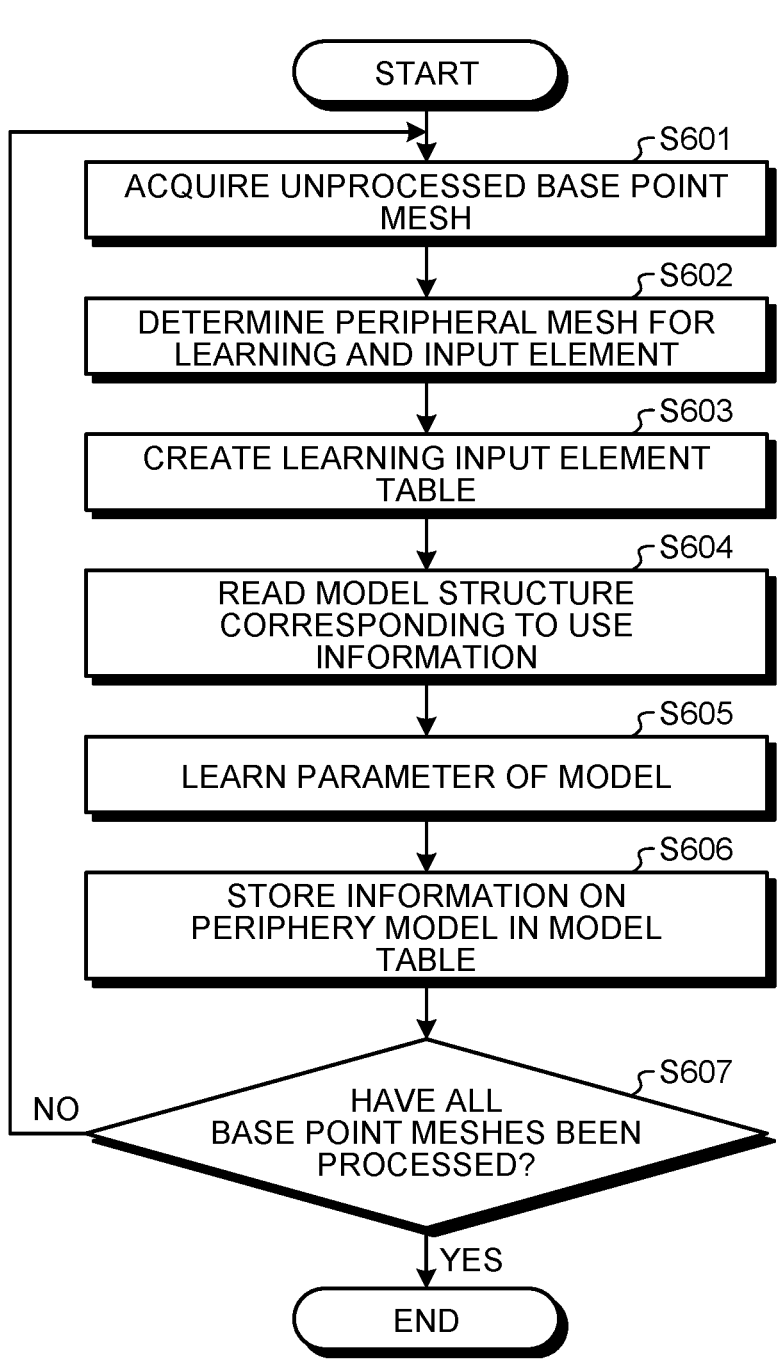
FIG. 20 is a flowchart of learning processing according to a modified example.

In the model building processing after the model structure for each use information is determined, instead of building a plurality of periphery model candidates and selecting one from the plurality of candidates, the periphery model for each mesh is built using the determined model structure. For example, instead of Steps S102 and S103 of the model building processing of FIG. 12, the learning processing as illustrated in FIG. 20 is performed. FIG. 20 is a flowchart illustrating an example of the learning processing of learning the parameter of the determined model structure.

Step S601 is similar to Step S201 of the candidate building processing in FIG. 13.

The model building module 103 determines the peripheral mesh for learning and the input element (Step S602). For example, the model building module 103 determines one or more peripheral meshes present within the distance set in the learning setting file 123 from the center of the acquired base point mesh as the peripheral meshes for learning. In addition, the model building module 103 determines a distance from the center of the base point mesh to the center of the peripheral mesh for learning as the input element E1. In the present modified example, the model building module 103 further determines the use information of the peripheral mesh as the input element E2.

The model building module 103 creates the learning input element table 125 (Step S603). In the present modified example, the learning input element table 125 includes the input element E2 (use information) in addition to the input element E1 (distance).

The model building module 103 reads the model structure corresponding to the use information from the selected model table (Step S604). The model building module 103 obtains the parameter of the periphery model having the read model structure by learning (Step S605). The learning method is similar to Step S205 of the above-described embodiment. The model building module 103 stores information on the trained periphery model in the model table 129 (Step S606).

The model building module 103 determines whether or not all the base point meshes have been processed (Step S607). In a case where not all the base point meshes have been processed (Step S607: No), the processing returns to Step S601, and the processing is repeated for the unprocessed base point mesh. In a case where all the base point meshes have been processed (Step S607: Yes), the model building module 103 ends the learning processing.

As described above, in the present modified example, a model structure for a specific input element (attribute information) can be selected using the past learning result (model selection result). For example, the exponential model can be selected as the model structure for the business area, and the regression model can be selected as the model structure for the green area.

Third Modified Example

In the above-described embodiment, the model building module 103 builds the periphery model by selecting one from a plurality of periphery model candidates. A method of building the periphery model by the model building module 103 is not limited thereto. In the present modified example, an example of building one periphery model by integrating a plurality of periphery model candidates will be described.

The model building module 103 builds the periphery model in which a plurality of candidates are integrated by applying ensemble learning as in the following Equation (5), for example. x represents the input element, $m_s$ represents each periphery model candidate ($1 \leq s \leq S$, and S is the number of candidates), $\beta_s$ represents a weighting coefficient for each periphery model candidate, and M(x) represents the periphery model to be built.

$$M(x) = \sum_{s=1}^{S} \beta_s m_s(x) \tag{5}$$

The ensemble learning method may be any method, and for example, AdaBoost, LPBoost, BrownBoost, LogitBoost, and the like can be applied.

As described above, in the first embodiment, the prediction model for predicting the stream-of-people data for the periphery from the stream-of-people data acquired for the base point can be built, the stream-of-people data for the periphery can be predicted by using the prediction model. Therefore, the accuracy in predicting the stream-of-people data using the periphery model can be improved.

Second Embodiment

In a second embodiment, a function of determining whether the mesh is the base point or the periphery is added. In the present embodiment, a function of treating a region obtained by integrating a plurality of base point meshes as the base point is added.

Figure 21:
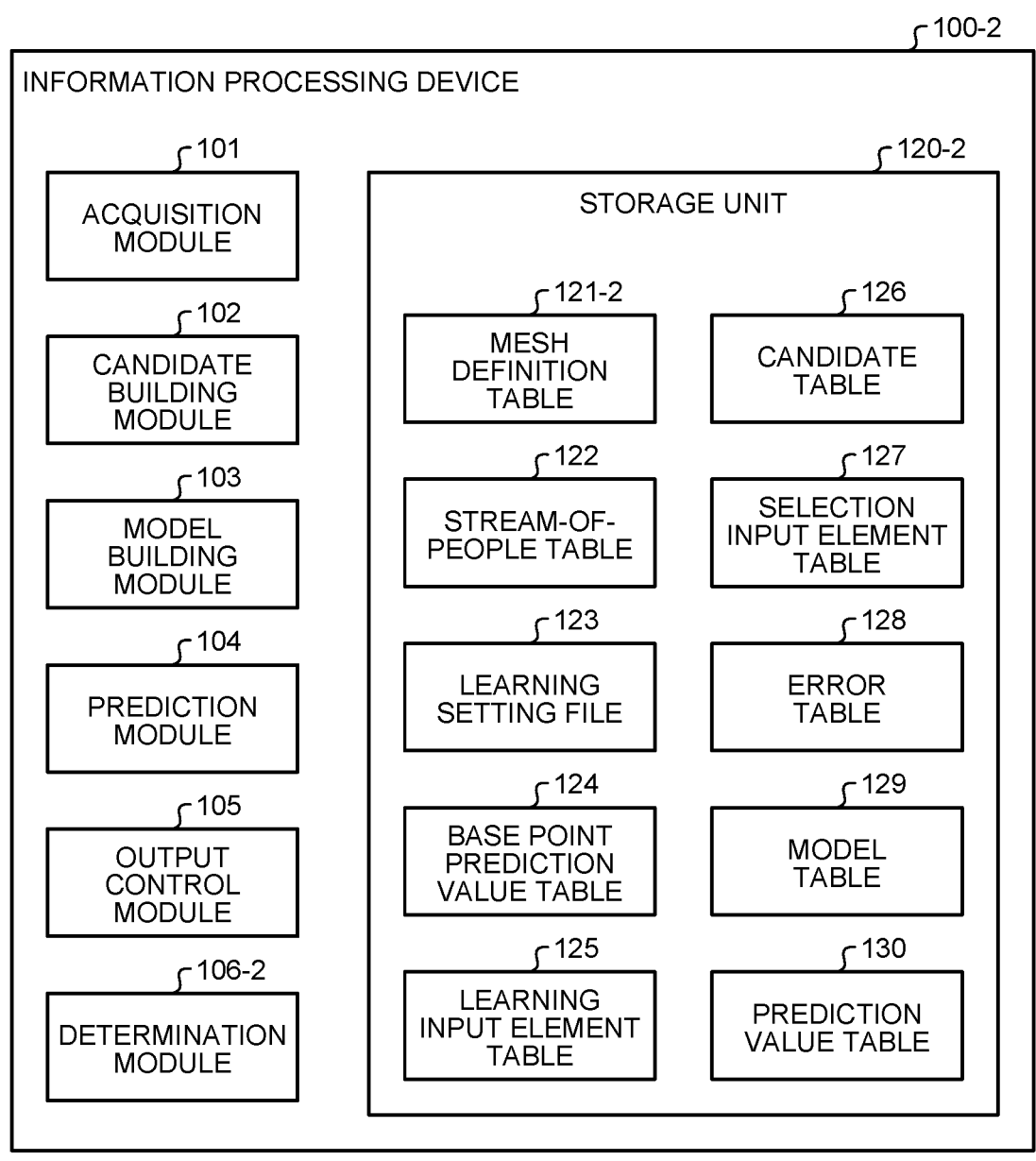
FIG. 21 is a block diagram of an information processing device according to a second embodiment.

FIG. 21 is a block diagram illustrating an example of a configuration of an information processing device 100-2 according to the second embodiment. As illustrated in FIG. 21, the information processing device 100-2 includes an acquisition module 101, a candidate building module 102, a model building module 103, a prediction module 104, an output control module 105, a determination module 106-2, and a storage unit 120-2.

The second embodiment is different from the first embodiment in that the determination module 106-2 is added and a data structure of a mesh definition table 121-2 in the storage unit 120-2 is changed. Other configurations and functions are similar to those in FIG. 1 that is a block diagram of the information processing device 100 according to the first embodiment, and thus, are denoted by the same reference signs, and a description thereof is omitted here.

The determination module 106-2 determines whether the mesh is the base point mesh or the peripheral mesh. Furthermore, the determination module 106-2 determines a region obtained by integrating a plurality of base point meshes as a new base point (base point mesh). Note that the determination module 106-2 may be configured to have only one of a function of determining the mesh type and a function of integrating the base point meshes.

The mesh definition table 121-2 is different from the mesh definition table 121 of the first embodiment in that the mesh definition table 121-2 further includes a base point ID in addition to the mesh ID, the mesh position, and the mesh type.

FIG. 22 is a diagram illustrating an example of a data structure of the mesh definition table 121-2. The mesh definition table 121-2 includes the mesh ID, the mesh position, the mesh type, and the base point ID. The base point ID is identification information assigned to a mesh obtained by integrating a plurality of base point meshes. The base point ID is used instead of the base point mesh IDs of the integrated base point meshes.

Figure 23:
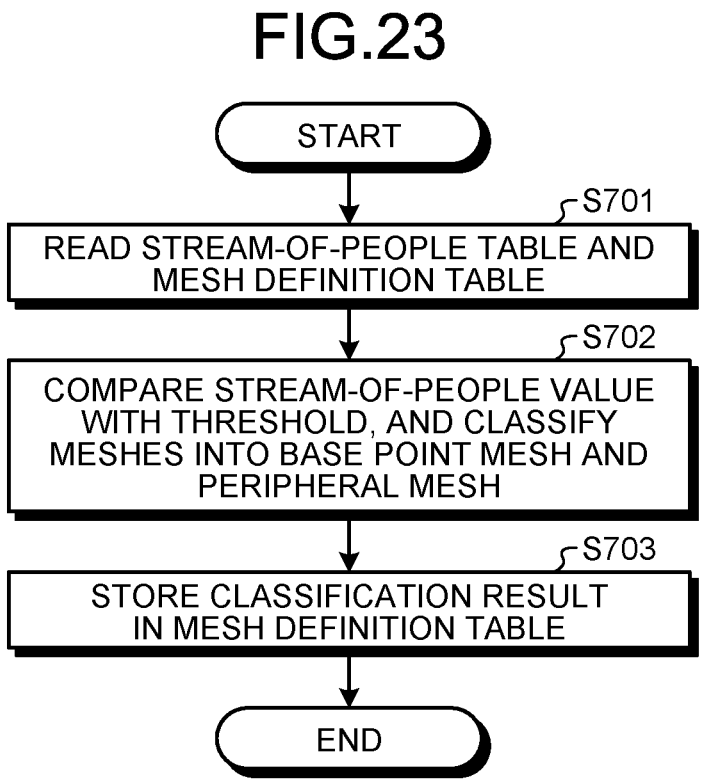
FIG. 23 is a flowchart of definition generation processing according to the second embodiment.

Next, definition generation processing for generating the mesh definition table 121-2 according to the second embodiment will be described. FIG. 23 is a flowchart illustrating an example of the definition generation processing according to the second embodiment.

The determination module 106-2 reads a stream-of-people table 122 and the mesh definition table 121-2 (Step S701). Note that, at this point, it is assumed that only the mesh ID and the mesh position are set in the mesh definition table 121-2.

The determination module 106-2 specifies a stream-of-people value corresponding to the mesh ID in the mesh definition table 121-2 from the stream-of-people table 122. For example, the determination module 106-2 specifies the sum of values of the stream of people within a certain period or the maximum value of the stream of people within a certain period as the value the stream of people of the mesh ID. The determination module 106-2 compares the specified value of the stream of people with a threshold, classifies a mesh whose value of the stream of people is equal to or more than the threshold as the base point mesh, and classifies a mesh whose value of the stream of people is less than the threshold as the peripheral mesh (Step S702).

The determination module 106-2 stores the mesh type obtained as a result of the classification in the mesh definition table 121-2 (Step S703), and ends the definition generation processing.

Note that a method of classifying the mesh is not limited to the method in which the stream-of-people value is compared with the threshold. For example, the determination module 106-2 may classify the mesh type by using attribute information of the mesh. For example, the determination module 106-2 may classify a mesh whose regional characteristic (an example of the attribute information) is a specific characteristic (for example, a railway station) as the base point.

Next, integration processing of integrating a plurality of base point meshes will be described. FIG. 24 is a flowchart illustrating an example of the integration processing according to the second embodiment.

The determination module 106-2 reads the mesh definition table 121-2 (Step S801). Note that, at this point, the base point ID is not set in the mesh definition table 121-2.

The determination module 106-2 sets a threshold of a Euclidean distance between the meshes (Step S802). The determination module 106-2 may set a predetermined value as the threshold, or may set a value read from a threshold setting file or the like as the threshold.

The determination module 106-2 acquires an unprocessed base point mesh among the base point meshes read from the mesh definition table 121-2 (Step S803). The determination module 106-2 integrates the acquired base point mesh and another base point mesh whose Euclidean distance from the acquired base point mesh is equal to or less than the threshold into one base point mesh (Step S804).

The determination module 106-2 determines whether or not all the base point meshes in the mesh definition table 121-2 have been processed (Step S805). In a case where not all the base point meshes have been processed (Step S805: No), the processing returns to Step S803, and the processing is repeated for the next unprocessed base point mesh. In a case where all the base point meshes have been processed (Step S805: Yes), the determination module 106-2 assigns a base point ID to the base point mesh obtained by the integration, and stores the assigned base point ID in the mesh definition table 121-2 (Step S806).

In the following processing, in a case where the base point ID is set, a mesh obtained by integrating a plurality of base point meshes for which the same base point ID is set is treated as one base point mesh. In a case where the center of the mesh is used as a starting point of the distance, the center of the base point mesh obtained by the integration can be obtained from the mesh positions of the plurality of base point meshes that are integrated, and the like.

As described above, in the information processing device according to the second embodiment, the base point mesh can be set more flexibly.

Example of Screen

Figure 25:
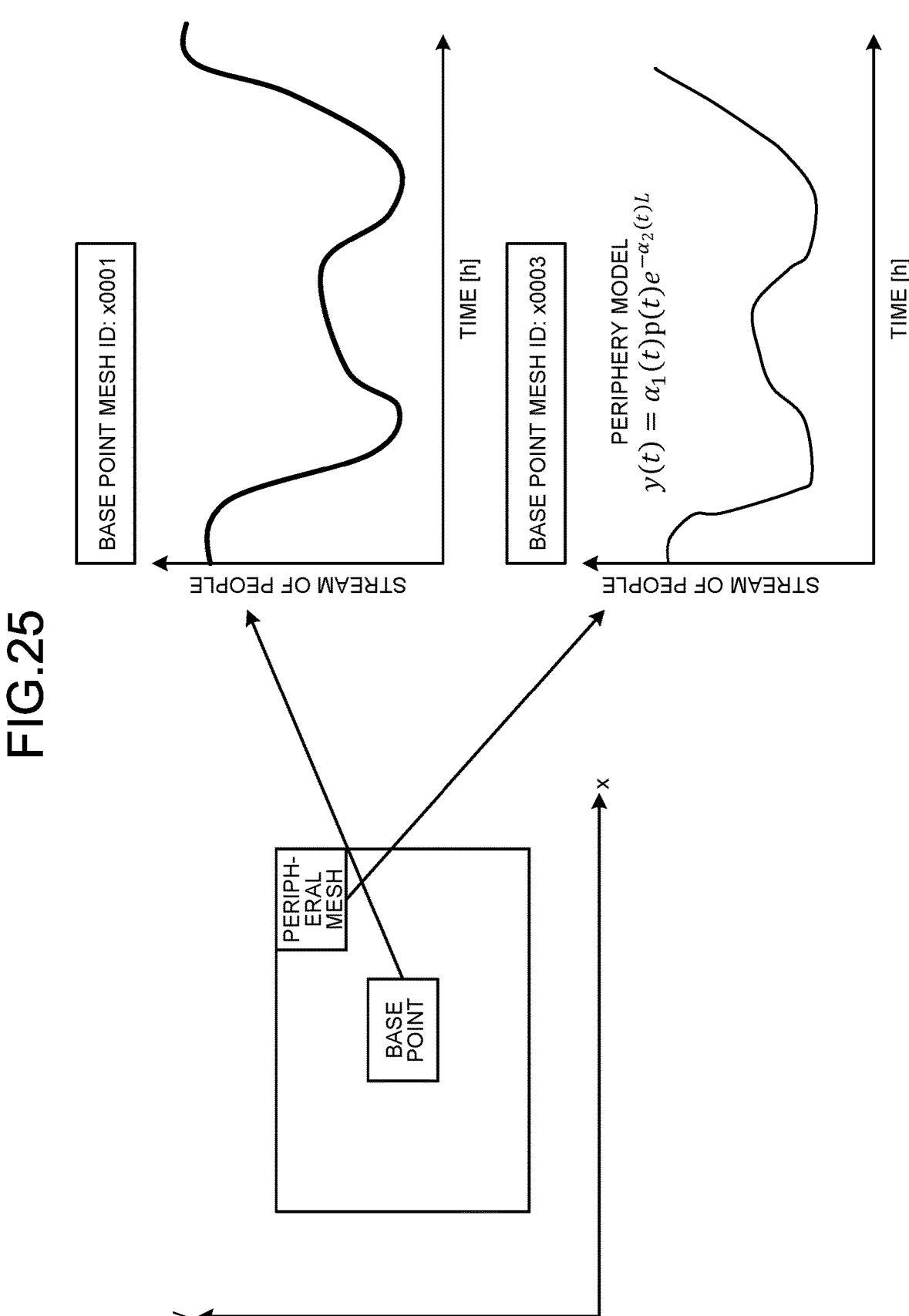
FIG. 25 is a diagram illustrating an example of a screen showing an analysis result.
Figure 26:
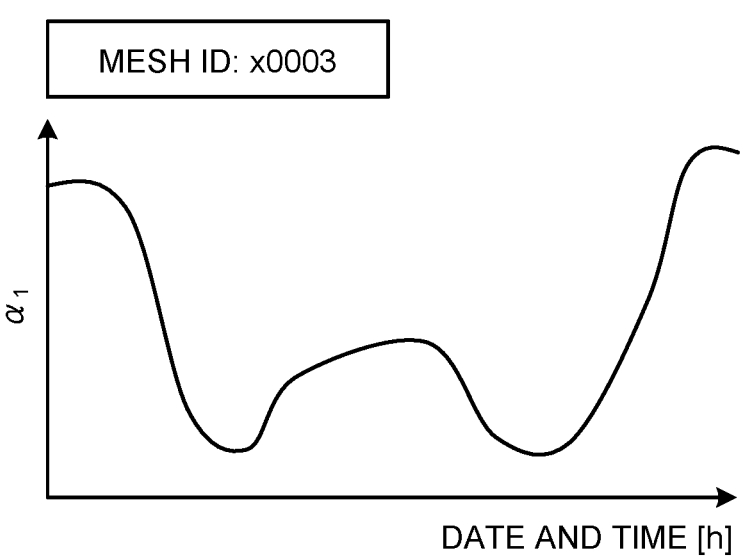
FIG. 26 is a diagram illustrating an example of a screen showing an analysis result.
Figure 27:
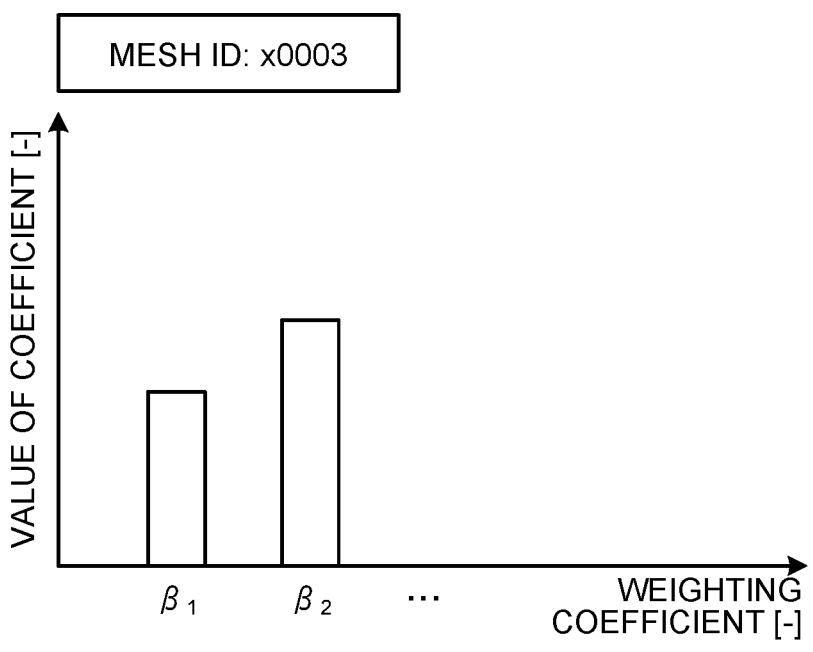
FIG. 27 is a diagram illustrating an example of a screen showing an analysis result.

Next, examples of screens applicable to the first and second embodiments will be described with reference to FIGS. 25 to 27. FIGS. 25 to 27 are diagrams each illustrating an example of a screen showing an analysis result using the above-described embodiments. Each screen is displayed by, for example, the output control module 105.

FIG. 25 is an example of a screen displaying time-series data of the stream of people in the base point mesh and time-series data for the peripheral mesh predicted based on the time-series data of the stream of people in the base point mesh. By presenting such a screen to the user, the user can easily understand a relationship between the stream of people in the peripheral mesh and the stream of people in the base point mesh.

FIG. 26 is an example of a screen displaying a temporal change of the parameter $\alpha(t)=[\alpha_1(t), \alpha_2(t), \ldots]$ of the periphery model. Note that FIG. 26 illustrates an example of a screen displaying the parameter $\alpha_1(t)$, but parameters after $\alpha_2(t)$ may be displayed on the same screen or different screens. With such a screen, the user can easily understand environmental factors causing the stream of people.

FIG. 27 is an example of a screen displaying a value of a weighting coefficient $\beta(t)=[\beta_1(t), \beta_2(t), \ldots]$ in a case where the periphery model is built by the ensemble learning. With such a screen, the user can easily understand a model selection policy according to environmental conditions, for example.

As described above, according to the first and second embodiments, the data prediction using the model can be performed with higher accuracy.

Figure 28:
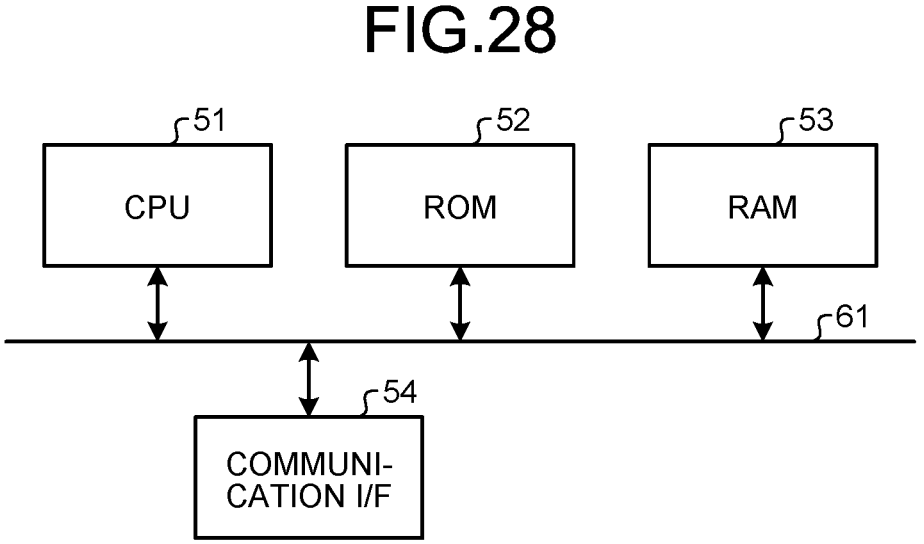
FIG. 28 is a hardware configuration diagram of the information processing device according to the first or second embodiment.

Next, a hardware configuration of the information processing device according to the first or second embodiment will be described with reference to FIG. 28. FIG. 28 is a diagram for describing an example of the hardware configuration of the information processing device according to the first or second embodiment.

The information processing device according to the first or second embodiment includes a control device such as a CPU 51, a storage device such as a read only memory (ROM) 52 or a RAM 53, a communication interface (I/F) 54 that is connected to a network and performs communication, and a bus 61 that connects the respective units.

A program executed by the information processing device according to the first or second embodiment is provided by being incorporated in the ROM 52 or the like in advance.

The program executed by the information processing device according to the first or second embodiment may be configured to be recorded as a file in an installable format or an executable format in a computer-readable recording medium such as a compact disk read only memory (CD-ROM), a flexible disk (FD), a compact disk recordable (CD-R), or a digital versatile disk (DVD) and provided as a computer program product.

Further, the program executed by the information processing device according to the first or second embodiment may be stored in a computer connected to a network such as the Internet and may be provided by being downloaded via the network. Furthermore, the program executed by the information processing device according to the first or second embodiment may be provided or distributed via a network such as the Internet.

The program executed by the information processing device according to the first or second embodiment can cause a computer to function as each unit of the information processing device described above. In this computer, the CPU 51 can read a program from a computer-readable storage medium onto a main storage device and execute the program.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An information processing device comprising:
one or more processors configured to:
build a prediction model by determining a structure of the prediction model;
train the prediction model by machine learning that uses acquired data for learning, the acquired data including one or more pieces of object data acquired for one or more first regions included in a plurality of regions, the object data representing an object including at least one of a stream of people, power consumption, and weather information, an input to the prediction model being the acquired data, an output from the prediction model being prediction data that is a prediction value of the object data for a second region included in a plurality of regions, the second region being a region from which the object data is not acquired; and
predict the prediction data by inputting the acquired data for prediction to the prediction model.

2. The device according to claim 1, wherein
the one or more processors are further configured to:
build a plurality of model candidates for predicting the prediction data based on the acquired data; and
build one of the plurality of model candidates as the prediction model.

3. The device according to claim 2, wherein the one or more processors are configured to build, as the prediction model, a candidate having a smaller error between the prediction data and a true value than those of other candidates among the plurality of model candidates.

4. The device according to claim 2, wherein the one or more processors are configured to build, as the prediction model, a candidate that is most frequently selected up to a specific time point among the plurality of model candidates.

5. The device according to claim 1, wherein
the one or more processors are further configured to:
build a plurality of model candidates for predicting the prediction data based on the acquired data; and
build the prediction model by integrating the plurality of model candidates.

6. The device according to claim 1, wherein the prediction model outputs different pieces of the prediction data according to attribute information of the second region.

7. The device according to claim 6, wherein the attribute information includes at least one of a distance from the second region to the one or more first regions, information on traffic in the second region, information indicating use of the second region, and weather information of the second region.

8. The device according to claim 6, wherein
the attribute information includes information on traffic in the second region, and
the information on traffic includes at least one of a number of train tracks, a number of bus stops, and a number of people using the traffic.

9. The device according to claim 6, wherein
the attribute information includes information indicating use of the second region, and
the use indicates at least one of a residential area, an office area, a commercial use area, an industrial area, and a green area.

10. The device according to claim 1, wherein the prediction model includes one of an exponential model, a regression model, and a neural network model.

11. The device according to claim 1, wherein the one or more processors are further configured to determine one or more new first regions that include a region obtained by integrating at least two regions among the plurality of first regions.

12. The device according to claim 1, wherein the one or more processors are further configured to:
determine a region of which region object data is equal to or more than a threshold as one of the one or more first regions, the region object data being a sum of values of the object data within a certain period or a maximum value of the object data within the certain period; and
determine a region of which the region object data is less than the threshold as the second region.

13. The device according to claim 1, wherein the one or more processors are further configured to:
determine a region of which attribute information is specific attribute information as one of the one or more first regions; and
determine a region of which the attribute information is not the specific attribute information as the second region.

14. An information processing method comprising:
building a prediction model by determining a structure of the prediction model;
train the prediction model by machine learning that uses acquired data for learning, the acquired data including one or more pieces of object data acquired for one or more first regions included in a plurality of regions, the object data representing an object including at least one of a stream of people, power consumption, and weather information, an input to the prediction model being the acquired data, an output from the prediction model being prediction data that is a prediction value of the object data for a second region included in a plurality of regions, the second region being a region from which the object data is not acquired; and
predicting the prediction data by inputting the acquired data for prediction to the prediction model.

15. A computer program product comprising a non-transitory computer-readable medium including programmed instructions, the instructions causing a computer to execute:

building a prediction model by determining a structure of the prediction model;

training the prediction model by machine learning that uses acquired data for learning, the acquired data including one or more pieces of object data acquired for one or more first regions included in a plurality of regions, the object data representing an object including at least one of a stream of people, power consumption, and weather information, an input to the prediction model being the acquired data, an output from the prediction model being prediction data that is a prediction value of the object data for a second region included in a plurality of regions, the second region being a region from which the object data is not acquired; and predicting the prediction data by inputting the acquired data for prediction to the prediction model.

* * * * *